(12) United States Patent
Kavalieros et al.

(10) Patent No.: US 8,119,508 B2
(45) Date of Patent: *Feb. 21, 2012

(54) FORMING INTEGRATED CIRCUITS WITH REPLACEMENT METAL GATE ELECTRODES

(75) Inventors: Jack Kavalieros, Portland, OR (US); Justin K. Brask, Portland, OR (US); Mark L. Doczy, Beaverton, OR (US); Matthew V. Metz, Hillsboro, OR (US); Suman Datta, Beaverton, OR (US); Uday Shah, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/781,084

(22) Filed: May 17, 2010

(65) Prior Publication Data
US 2010/0219456 A1 Sep. 2, 2010

Related U.S. Application Data

(63) Continuation of application No. 10/925,468, filed on Aug. 25, 2004, now Pat. No. 7,718,479.

(51) Int. Cl.
*H01L 21/20* (2006.01)
(52) U.S. Cl. ............... 438/584; 438/595; 257/E21.21; 257/E29.159
(58) Field of Classification Search ............... 438/584, 438/595; 257/E21.19, E21.159
See application file for complete search history.

(56) References Cited

U.S. PATENT DOCUMENTS

| 6,060,376 | A | 5/2000 | Gabriel et al. |
| 6,180,997 | B1 | 1/2001 | Lin |
| 6,277,757 | B1 | 8/2001 | Lin |
| 6,278,189 | B1 | 8/2001 | Jeng et al. |
| 6,287,924 | B1 | 9/2001 | Chao et al. |
| 6,346,450 | B1 | 2/2002 | Deleonibus et al. |
| 6,764,897 | B2 | 7/2004 | Lowrey et al. |
| 7,071,517 | B2 | 7/2006 | Kim et al. |
| 7,208,361 | B2 | 4/2007 | Shah et al. |
| 2003/0235943 | A1 | 12/2003 | Trivedi |
| 2004/0023478 | A1* | 2/2004 | Samavedam et al. ......... 438/592 |

(Continued)

FOREIGN PATENT DOCUMENTS

CN 1476064 A 2/2004

(Continued)

OTHER PUBLICATIONS

Office Action received for Chinese Patent Application No. 200580028560.7, mailed on May 9, 2008, 14 pages of Chinese Office Action including 8 pages of English Translation.

(Continued)

*Primary Examiner* — Tom Thomas
*Assistant Examiner* — Matthew Reames
(74) *Attorney, Agent, or Firm* — David L. Guglielmi

(57) ABSTRACT

In a metal gate replacement process, a stack of at least two polysilicon layers or other materials may be formed. Sidewall spacers may be formed on the stack. The stack may then be planarized. Next, the upper layer of the stack may be selectively removed. Then, the exposed portions of the sidewall spacers may be selectively removed. Finally, the lower portion of the stack may be removed to form a T-shaped trench which may be filled with the metal replacement.

5 Claims, 6 Drawing Sheets

U.S. PATENT DOCUMENTS

2004/0038474 A1 2/2004 Clevenger et al.
2005/0269644 A1 12/2005 Brask et al.

FOREIGN PATENT DOCUMENTS

WO 2006/026007 A1 3/2006

OTHER PUBLICATIONS

Office Action received for Taiwanese Patent Application No. 94125619, mailed on Sep. 21, 2006, 10 pages of Taiwanese Office Action including 5 pages of English Translation.

Office Action received for Chinese Patent Application No. 200580028560.7, mailed on Nov. 14, 2008, 9 pages of Chinese Office Action including 5 pages of English Translation.

Office Action received for Chinese Patent Application No. 200580028560.7, mailed on Apr. 3, 2009, 9 pages of Chinese Office Action including 5 pages of English Translation.

International Search Report and Written Opinion received for PCT Patent Application No. PCT/US2005/027062, mailed on Jan. 12, 2006, 14 pages.

International Preliminary Report on Patentability received for PCT Patent Application No. PCT/US2005/027062, mailed on Mar. 8, 2007, 9 pages.

\* cited by examiner

FORMING INTEGRATED CIRCUITS WITH REPLACEMENT METAL GATE ELECTRODES

CLAIM OF PRIORITY

This application is a continuation of and claims priority to U.S. patent application Ser. No. 10/925,468 filed on Aug. 25, 2004, and issued on May 18, 2010, as U.S. Pat. No. 7,718,479, entitled "FORMING INTEGRATED CIRCUITS WITH REPLACEMENT METAL GATE ELECTRODES," which is incorporated herein by reference in its entirety.

BACKGROUND

The present invention relates to methods for making semiconductor devices, and in particular, semiconductor devices with metal gate electrodes.

When making a complementary metal oxide semiconductor (CMOS) device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal.

Current processes for etching polysilicon layers generate patterned polysilicon layers. A sidewall spacer is used to form graded junction source drain regions. The structure is ultimately filled with an interlayer dielectric. With tight pitch technologies, voids in the interlayer dielectric may be created between gate structures. These voids may render the product unusable.

Accordingly, there is a need for an improved method for making a semiconductor device that includes metal gate electrodes.

Features shown in these Figures are not intended to be drawn to scale.

DETAILED DESCRIPTION

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
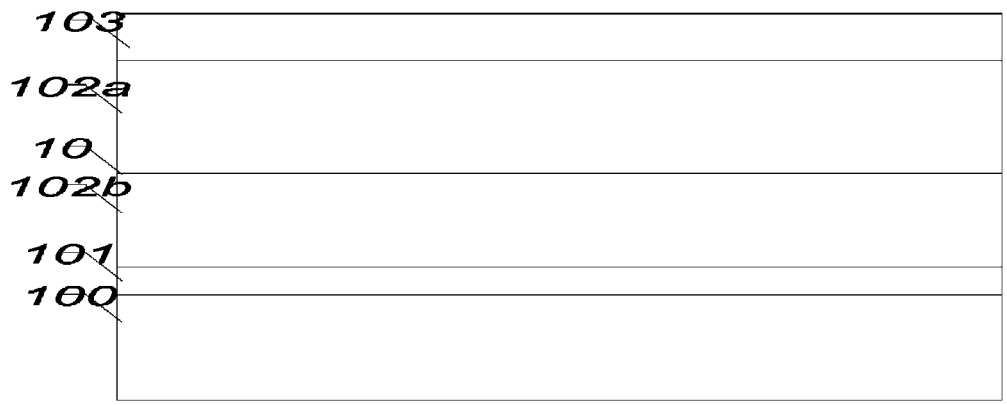
FIGS. 1A-1C represent cross-sections of structures that may be formed when carrying out an embodiment of the method of the present invention.
Figure 1B:
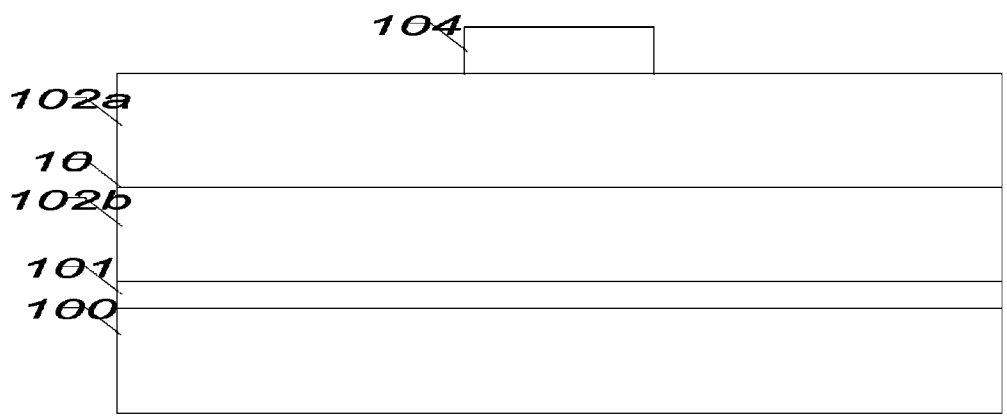
Figure 1C:
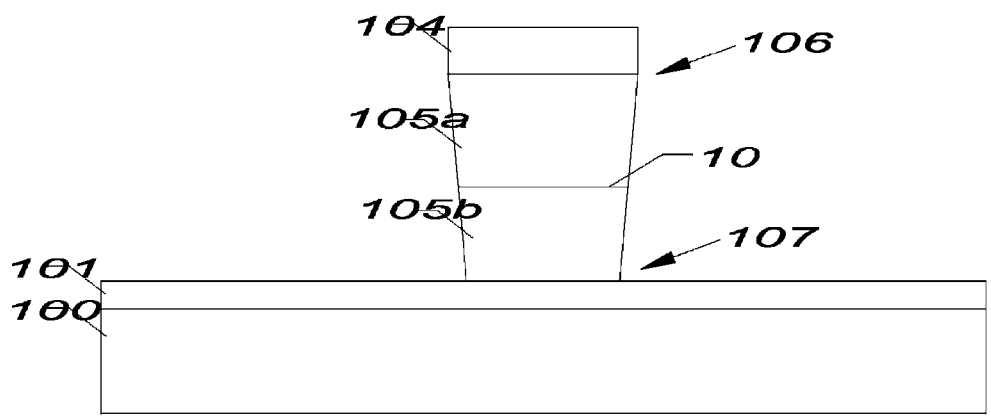

FIGS. 1A-1C illustrate structures that may be formed, when carrying out an embodiment of the method of the present invention. Initially, dielectric layer 101 is formed on substrate 100, layers 102a and 102b are formed on dielectric layer 101, and a hard mask 104 is formed on layer 102, generating the FIG. 1A structure. In some embodiments an etch stop layer 10 may be formed between the layers 102a and 102b. The etch stop layer 10 may be formed of a dielectric, such as thermally grown silicon oxide, as one embodiment. The layer 10 may be between 10 and 30 Angstroms (e.g., 20 Angstroms) in one embodiment.

In some embodiments, the layers 102a and 102b may be formed of the same material, such as polysilicon. In other embodiments, the layers 102a and 102b may be formed of different materials such that the layer 102a may be selectively etched without substantially etching the layer 102b, for example even when no etch stop layer 10 is used. For example, one of the layers 102a or 102b may be silicon and the other may be germanium.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dielectric layer 101 may comprise silicon dioxide, a nitrided silicon dioxide, a high-dielectric constant (k) dielectric layer, or other materials that may protect substrate 100. A high-k dielectric has a dielectric constant greater than 10. Layers 102a and 102b may be between about 50 and about 1,000 Angstroms thick, and between about 250 and about 800 Angstroms thick. Hard mask 104 may comprise silicon nitride, silicon dioxide, and/or silicon oxynitride, and may be between about 100 and about 500 Angstroms thick. Dielectric layer 101, layer 102, and masking layer 103 may be formed using conventional process steps.

After forming the FIG. 1A structure, the device may be transferred to a high density plasma etch tool, e.g., an electron cyclotron resonance etcher, and placed on a chuck that is positioned within the tool. The etch tool may then be operated to etch masking layer 103, generating hard mask 104 as FIG. 1B illustrates. Depending upon the material used to form masking layer 103, that layer may be etched by exposing it to a plasma that is derived from $C_4F_8$, argon and oxygen, or that is derived from $CH_3F$, carbon monoxide, and oxygen.

After forming hard mask 104, layer 102 is etched to generate patterned layers 105a and 105b, as shown in FIG. 1C. Patterned layer 105a has an upper surface 106 and layer 105b has a lower surface 107. For one embodiment, the width of upper surface 106 may be less than or equal to about 45 Angstroms, the width of lower surface 107 may be less than or equal to about 40 Angstroms, and the width of upper surface 106 may be at least about 5 Angstroms greater than the width of lower surface 107. In one embodiment, lower surface 107 meets dielectric layer 101 at an angle that is less than about 87°, but that is sufficiently wide to enable silicon nitride spacers to be formed on layer 105's sides. In other embodiments, oppositely slanted or vertical sides may be used.

Layer 102a may be patterned by applying to it a plasma derived from the combination of chlorine, hydrogen bromide, oxygen, and argon for a sufficient time to remove the exposed part of that layer. If the layer 102a is etched while dielectric layer 101 is electrically charged, the inverted taper profile shown in FIG. 1C may result because a charged dielectric layer may promote a slightly faster etch rate at the lower part of layer 102 than occurs at the upper part of that layer. Dielectric layer 101 may be sufficiently thick to maintain an electric charge for substantially the entire time that polysilicon layer 102 is etched.

The dielectric layer 101 may remain charged throughout the etch process, by controlling the radio frequency (RF) bias power that is delivered to the etch tool's chuck during that operation. The RF bias power that is applied to the chuck as layer 102 is etched may be less than about 100 watts in one embodiment. The frequency at which RF bias power is applied to the chuck may be selected to ensure that dielectric layer 101 remains charged when polysilicon layer 102 is etched. The optimum RF bias power that is applied, and the optimum frequency at which it is delivered, may depend upon the particular etch tool that is used to etch layer 102.

Figure 2A:
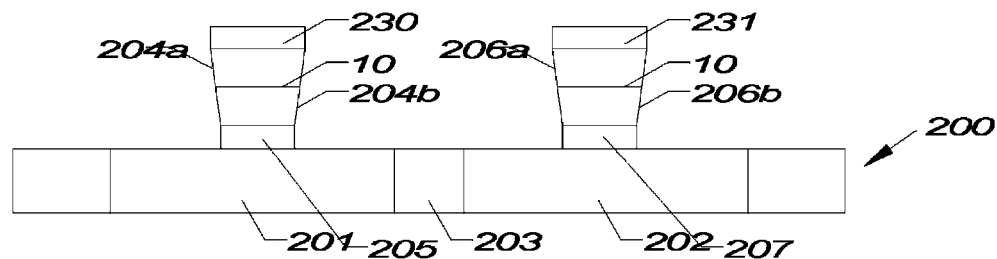
FIGS. 2A-2O represent cross-sections of structures that may be formed when carrying out an embodiment of the method of the present invention as applied to a replacement gate process.

FIG. 2A represents an intermediate structure that may be formed when making a complimentary metal oxide semiconductor (CMOS) device. That structure includes first part 201 and second part 202 of substrate 200. Isolation region 203 separates first part 201 from second part 202. Isolation region 203 may comprise silicon dioxide, or other materials that may separate the transistor's active regions.

In this embodiment, first layers 204a and 204b are formed on first dummy dielectric layer 205, and second layers 206a and 206b are formed on second dummy dielectric layer 207. In some embodiments, an etch stop layer 10 may be provided. The layers 204a and b and the layers 206a and b may correspond to the layers 102 and 102b in the previous embodiment. An etch stop layer 10 may also be provided in some embodiments. Hard masks 230, 231 are formed on layers 204, 206. First dummy dielectric layer 205 and second dummy dielectric layer 207 may each comprise silicon dioxide, or other materials that may protect substrate 200—e.g., silicon oxynitride, silicon nitride, a carbon doped silicon dioxide, or a nitrided silicon dioxide. Dummy dielectric layers 205, 207 may be sufficiently thick to maintain an electric charge for substantially the entire time that the polysilicon layer is etched in one embodiment.

As in the embodiment described above, layers 204a, 204b, 206a and 206b may be between about 50 and about 1,000 Angstroms thick, for example, between about 250 and about 800 Angstroms thick. Hard masks 230, 231 may comprise silicon nitride, silicon dioxide and/or silicon oxynitride, and may be between about 100 and about 1000 Angstroms thick. In one embodiment, the process steps described above may be used to create patterned polysilicon layers 204, 206 that have an inverted taper profile. Non-inverted or straight profiles may also be used. After forming patterned polysilicon layers 204, 206, a conventional etch process may be applied to generate patterned dummy dielectric layers 205, 207.

Figure 2B:
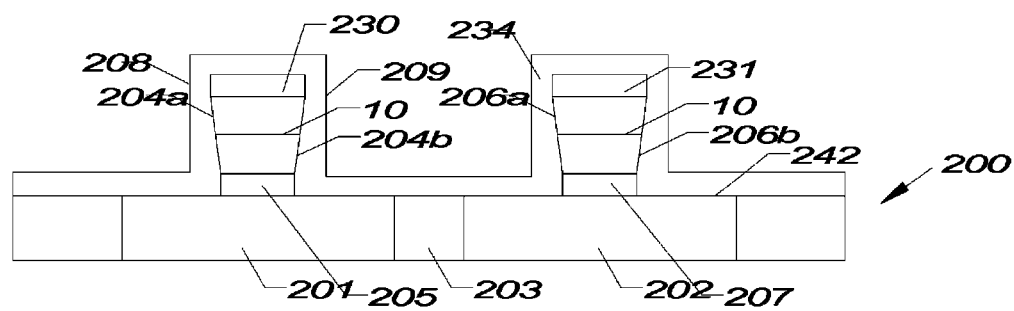

After forming the FIG. 2A structure, spacers are formed on opposite sides of patterned layers 204, 206. When those spacers comprise silicon nitride, they may be formed in the following way. First, a silicon nitride layer 234 of substantially uniform thickness, for example, less than about 1000 Angstroms thick—is deposited over the entire structure, producing the structure shown in FIG. 2B. Conventional deposition processes may be used to generate that structure.

In one embodiment, silicon nitride layer 234 is deposited directly on substrate 200, hard masks 230, 231, and opposite sides of patterned layers 204, 206—without first forming a buffer oxide layer on substrate 200 and layers 204, 206. In alternative embodiments, however, such a buffer oxide layer may be formed prior to forming layer 234. Similarly, although not shown in FIG. 2B, a second oxide may be formed on layer 234 prior to etching that layer. If used, such an oxide may enable the subsequent silicon nitride etch step to generate an L-shaped spacer.

Figure 2C:
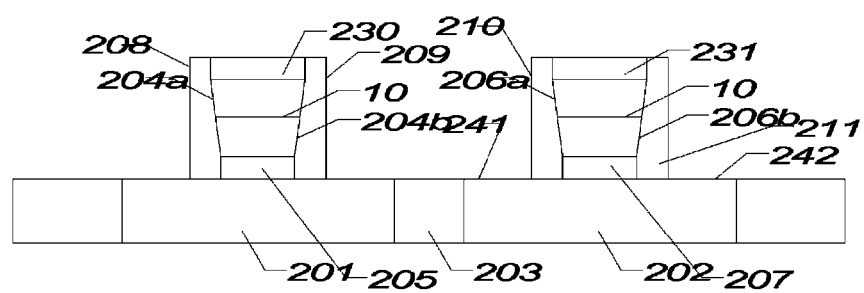
Figure 2D:
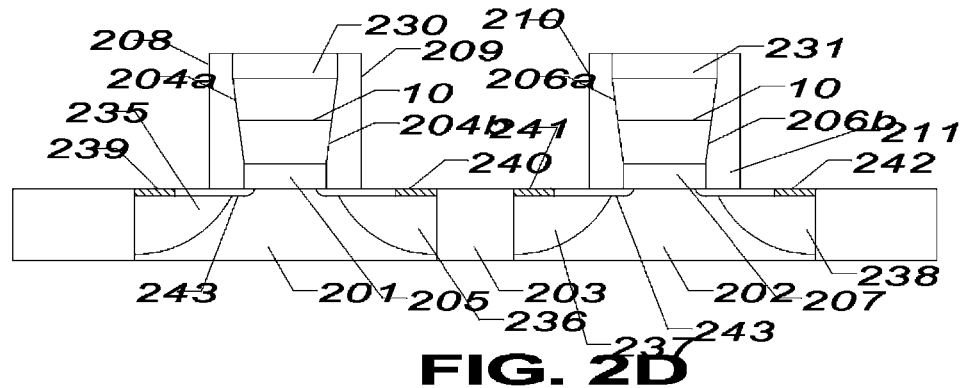

Silicon nitride layer 234 may be etched using a conventional process for anisotropically etching silicon nitride to create the FIG. 2C structure. When hard masks 230, 231 comprise silicon nitride, a timed etch may be used to prevent that anisotropic etch step from removing hard masks 230, 231, when silicon nitride layer 234 is etched. As a result of that etch step, patterned layer 204 is bracketed by a pair of sidewall spacers 208, 209, and patterned layer 206 is bracketed by a pair of sidewall spacers 210, 211.

As is typically done, it may be desirable to perform multiple masking and ion implantation steps to create lightly implanted regions 243 near layers 204, 206 (that will ultimately serve as tip regions for the devices' source and drain regions 235-238), prior to forming spacers 208, 209, 210, 211 on patterned layers 204, 206. Also as is typically done, the source and drain regions may be formed, after forming spacers 208, 209, 210, 211, by implanting ions into parts 201 and 202 of substrate 200, followed by applying an appropriate anneal step.

An ion implantation and anneal sequence used to form n-type source and drain regions within part 201 of substrate 200 may dope patterned layer 204 n-type at the same time. Similarly, an ion implantation and anneal sequence used to form p-type source and drain regions within part 202 of substrate 200 may dope patterned layer 206 p-type. When doping patterned polysilicon layer 206 with boron, that layer should include that element at a sufficient concentration to ensure that a subsequent wet etch process, for removing n-type patterned layer 204, will not remove a significant amount of p-type patterned layer 206.

Dummy dielectric layers 205, 207 may be sufficiently thick to prevent a significant number of ions from penetrating through layers 204, 206 and layers 205, 207. Using relatively thick dummy dielectric layers may enable one to optimize the process used to implant ions into the source and drain regions without having to consider whether that process will drive too many ions into the channel. After the ion implantation and anneal steps, part of the source and drain regions may be converted to a silicide using well known process steps. Hard masks 230, 231 will prevent layers 204, 206 from being converted into a silicide, when forming a silicide in the source and drain regions. Source and drain regions 235, 236, 237, 238, and tip region 243 are capped by silicided regions 239, 240, 241, 242.

Figure 2E:
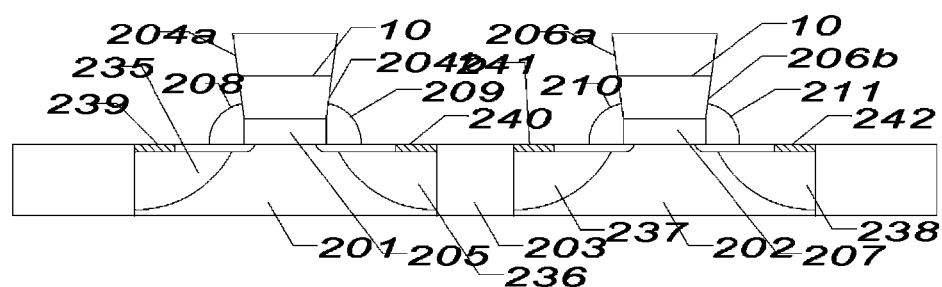

The spacers 208, 209, 210, and 211 may be eroded via wet etch using hydrofluoric acid for etching oxide spacers or phosphoric acid for etching nitride spacers to increase the spacing between gates, as shown in FIG. 2E. The resulting spacers 209 may have a height substantially less than their original height and the height of the patterned layers 204, 206. This may enable the void free deposition of the interlayer dielectric 212 shown in FIG. 2F. The hard masks 230 and 231 may also be removed in the same process, in some embodiments.

Figure 2F:
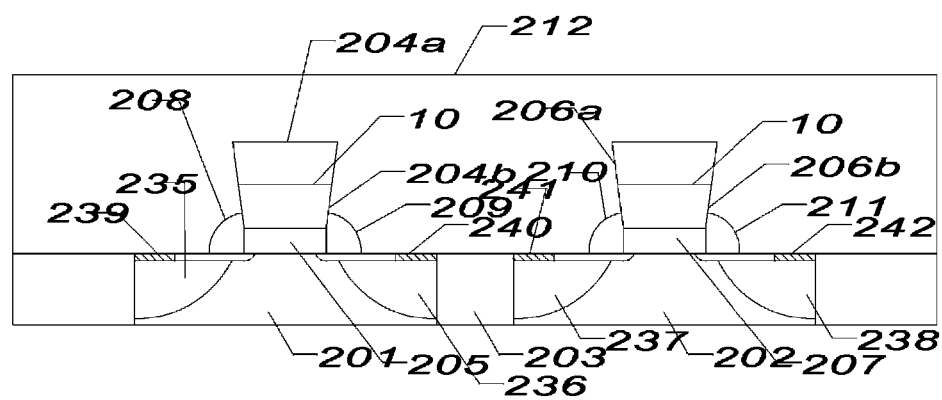

After eroding the spacers 208, 209, 210, 211, dielectric layer 212 may be deposited over the device, generating the FIG. 2F structure. Dielectric layer 212 may comprise silicon dioxide, or a low dielectric constant material. Dielectric layer 212 may be doped with phosphorus, boron, or other elements, and may be formed using a high density plasma deposition process. Conventional process steps, materials, and equipment may be used to generate those structures, as will be apparent to those skilled in the art.

Figure 2G:
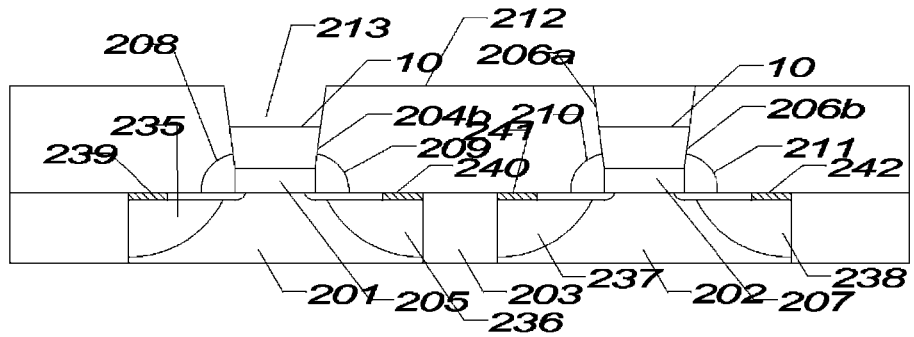

Dielectric layer 212 is removed from patterned layers 204, 206, producing the FIG. 2G structure. A conventional chemical mechanical polishing ("CMP") operation may be applied to remove that part of dielectric layer 212, and hard masks 230, 231.

After forming the FIG. 2F structure, patterned layer 204a is removed to generate trench 213 that is positioned between sidewall spacers 208, 209—producing the structure shown in FIG. 2G. In one embodiment, a wet etch process that is selective for layer 204a over patterned layers 206 and the layer 204b and/or the etch stop 10 is applied to remove layer 204a without removing significant portions of layers 206 or the layer 204b.

When patterned layer 204a is doped n-type, and patterned layer 206a is polysilicon doped p-type (e.g., with boron), such a wet etch process may comprise exposing patterned layer 204a to an aqueous solution that comprises a source of hydroxide for a sufficient time at a sufficient temperature to remove substantially all of layer 204a. That source of hydroxide may comprise between about 1 and about 10 percent by volume (e.g., 3%) ammonium hydroxide or a tetraalkyl ammonium hydroxide, e.g., tetramethyl ammonium hydroxide ("TMAH"), in deionized water, when the layer 204a is silicon and the layer 204b is germanium or if a silicon dioxide etch stop layer 10 is used.

Patterned layer 204a may be selectively removed by exposing it to a solution, which is maintained at a temperature between about 10° C. and about 30° C. (and preferably 15° C.), that comprises between about 2 and about 30 percent ammonium hydroxide by volume in deionized water. During that exposure step, which may last at least one minute, it may be desirable to apply sonic energy at a frequency of between about 0.5 to 1.5 MHz (e.g., 0.9 MHz), while dissipating at between about 0.5 and about 8 watts/cm$^2$ (e.g., 5 watts/cm$^2$).

As an alternative, if the upper layer 204a is germanium and the lower layer 204b is silicon, patterned layer 204a may be selectively removed by exposing it for at least 30 seconds to a solution, which is maintained at a temperature between about 20° C. and about 45° C., that comprises between about 5 and about 30 percent (e.g., 6.7%) by volume hydrogen peroxide in deionized water at a pH range of 8-12.5 (e.g., 9-10), while optionally applying sonic energy. Substantially all of that layer 204a may be removed without removing a significant amount of layer 206a or the layer 204b especially if the layer 204b is separated by an etch stop layer 10 or has a sufficiently different etch rate than the layer 204a. A timed etch may also be used. First dummy dielectric layer 205 should be sufficiently thick to prevent the etchant that is applied to remove patterned layer 204 from reaching the channel region that is located beneath first dummy dielectric layer 205.

Next, the upper exposed portions of the spacers 208 and 209 may be etched away. This may be done by an etch that is selective to the spacer material. The selective spacer etch, in one embodiment, may use 80-95% by volume (e.g., 88%) phosphoric acid in deionized water in a temperature range of 150-170° C. (e.g., 158° C.) with 0.1 to 5% nitride dissolved in solution as an oxide etch inhibitor to reduce interlayer dielectric thinning. A portion of the spacer 208, 209 above the remaining layer 204b may be completely or partially removed.

Figure 2H:
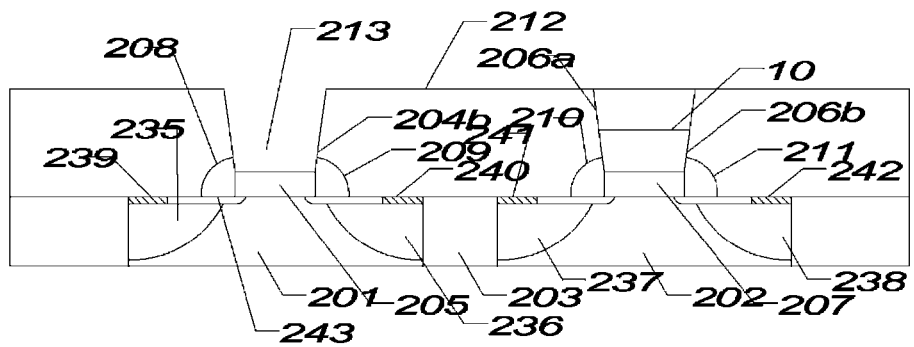

Thus, the structure shown in FIG. 2H has a countersunk gap 213 formed therein. Thereafter, a selective etch may be utilized to remove the layer 204b and/or any remaining etch stop layer 10. The resulting structure shown in FIG. 2H is devoid of any patterned layer 204. It has a wider opening 213 at the top and a slightly narrower opening at the bottom which will facilitate subsequent filling of the gap 213 as will be described hereafter.

Figure 2I:
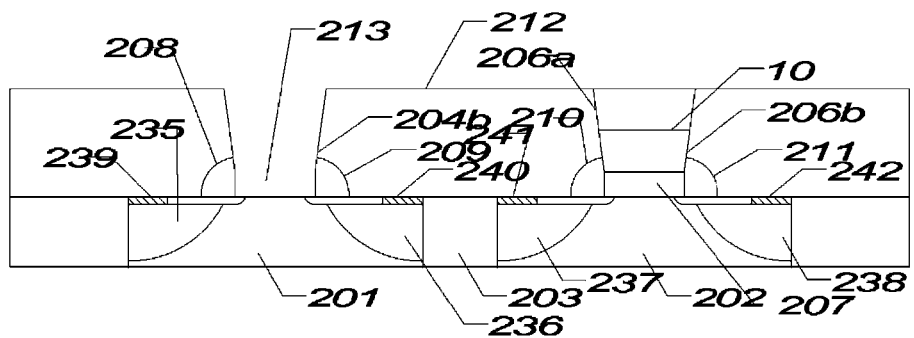

After removing patterned layer 204, first dummy dielectric layer 205 is removed. When first dummy dielectric layer 205 comprises silicon dioxide, it may be removed using an etch process that is selective for silicon dioxide to generate the FIG. 2I structure. Such etch processes include: exposing layer 205 to a solution that includes about 1 percent HF in deionized water, or applying a dry etch process that employs a fluorocarbon based plasma. Layer 205 should be exposed for a limited time, as the etch process for removing layer 205 may also remove part of dielectric layer 212.

Figure 2J:
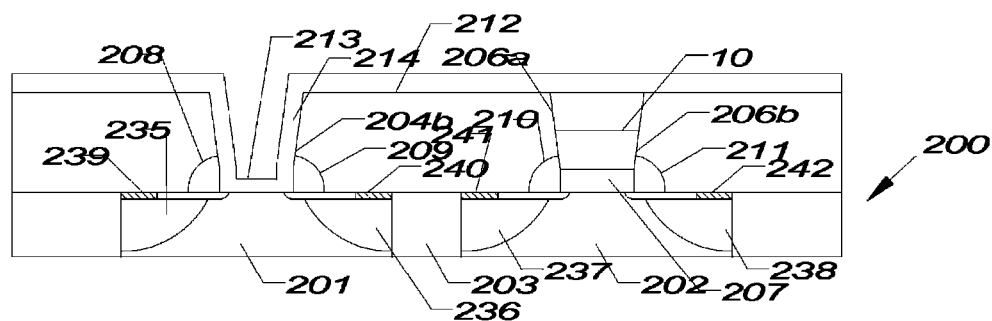

After removing first dummy dielectric layer 205, gate dielectric layer 214 is formed on substrate 200 at the bottom of trench 213, generating the FIG. 2J structure. The gate dielectric layer may be 10% of the spacer 208, 209 thickness in one embodiment. Although gate dielectric layer 214 may comprise any material that may serve as a gate dielectric for an NMOS transistor that includes a metal gate electrode, gate dielectric layer 214 may comprise a high-k dielectric material. Some of the materials that may be used to make high-k gate dielectric 214 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 214 are described here, that layer may be made from other materials. By "high-k" it is intended to refer to materials with dielectric constants greater than 10.

High-k gate dielectric layer 214 may be formed on substrate 200 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 200 and high-k gate dielectric layer 214. The CVD reactor may be operated long enough to form a layer with the desired thickness. In most applications, high-k gate dielectric layer 214 may be less than about 60 Angstroms thick, and for example, between about 5 Angstroms and about 40 Angstroms thick.

Figure 2K:
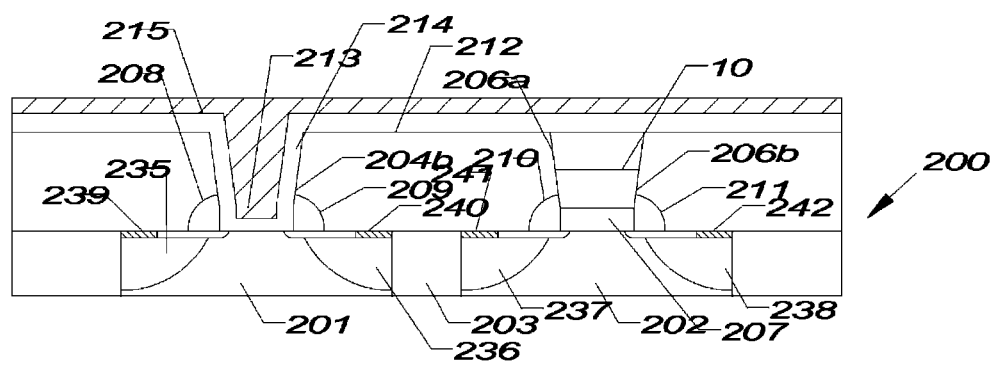

As shown in FIG. 2K, when an atomic layer CVD process is used to form high-k gate dielectric layer 214, that layer will form on the sides of trench 213 in addition to forming on the bottom of that trench. If high-k gate dielectric layer 214 comprises an oxide, it may manifest oxygen vacancies at random surface sites and unacceptable impurity levels, depending upon the process used to make it. It may be desirable to remove impurities from layer 214, and to oxidize it to generate a layer with a nearly idealized metal:oxygen stoichiometry, after layer 214 is deposited.

To remove impurities from that layer and to increase that layer's oxygen content, a wet chemical treatment may be applied to high-k gate dielectric layer 214. Such a wet chemical treatment may comprise exposing high-k gate dielectric layer 214 to a solution that comprises hydrogen peroxide at a sufficient temperature for a sufficient time to remove impurities from high-k gate dielectric layer 214 and to increase the oxygen content of high-k gate dielectric layer 214. The appropriate time and temperature at which high-k gate dielectric layer 214 is exposed may depend upon the desired thickness and other properties for high-k gate dielectric layer 214.

When high-k gate dielectric layer 214 is exposed to a hydrogen peroxide based solution, an aqueous solution that contains between about 2% and about 30% hydrogen peroxide by volume may be used. That exposure step may take place at between about 15° C. and about 40° C. for at least about one minute. In a particularly preferred embodiment, high-k gate dielectric layer 214 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watts/cm$^2$.

Although not shown in FIG. 2J, it may be desirable to form a capping layer, which is no more than about five monolayers thick, on high-k gate dielectric layer 214. Such a capping layer may be formed by sputtering one to five monolayers of silicon, or another material, onto the surface of high-k gate dielectric layer 214. The capping layer may then be oxidized, e.g., by using a plasma enhanced chemical vapor deposition process or a solution that contains an oxidizing agent, to form a capping dielectric oxide.

Although in some embodiments it may be desirable to form a capping layer on gate dielectric layer 214, in the illustrated embodiment, n-type metal layer 215 is formed directly on layer 214 to fill trench 213 and to generate the FIG. 2K structure with a metal layer 215. The countersunk arrangement of the trench 213 may facilitate trench filling. N-type metal layer 215 may comprise any n-type conductive material from which a metal NMOS gate electrode may be derived. Materials that may be used to form n-type metal layer 215 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 215 may be formed on high-k gate dielectric layer 214 using well known PVD or CVD processes, e.g., conventional sputter or atomic layer CVD processes.

Figure 2L:
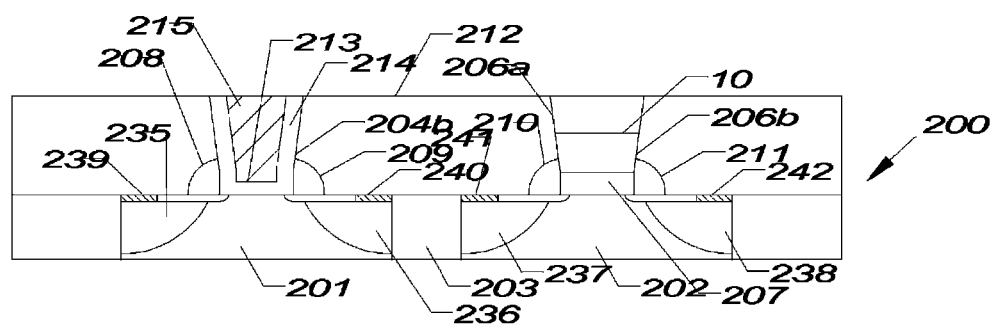

As shown in FIG. 2L, n-type metal layer 215 is removed except where it fills trench 213. Layer 215 may be removed from other portions of the device via a wet or dry etch process, or an appropriate CMP operation. Dielectric 212 may serve as an etch or polish stop, when layer 215 is removed from its surface. The remaining metal layer 215 may have a V-shape with a wider upper section and a narrower lower section.

Figure 2M:
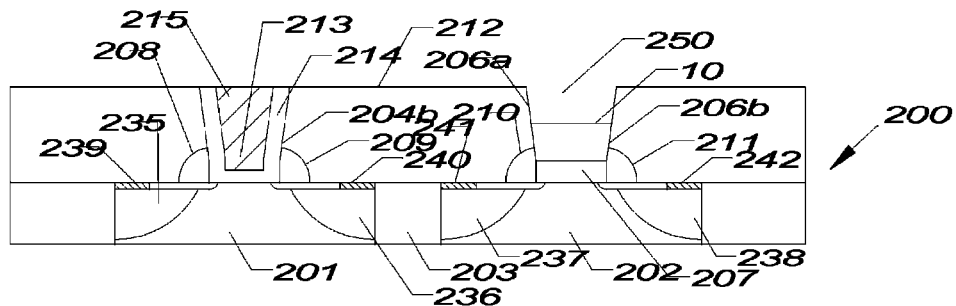
Figure 2N:
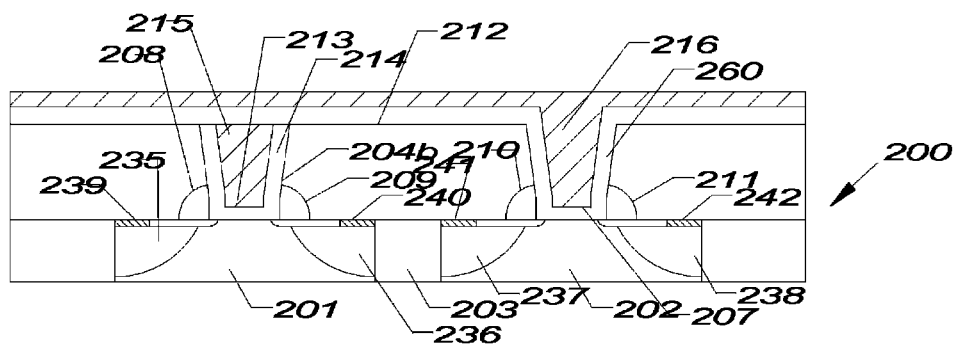

N-type metal layer 215 may serve as a metal NMOS gate electrode that has a workfunction that is between about 3.9 eV and about 4.3 eV, and that is between about 100 Angstroms and about 2,000 Angstroms thick, for example, between about 500 Angstroms and about 1,600 Angstroms thick. Although FIGS. 2L and 2M represent structures in which n-type metal layer 215 fills all of trench 213, in alternative embodiments, n-type metal layer 215 may fill only part of trench 213, with the remainder of the trench being filled with a material that may be easily polished, e.g., tungsten, aluminum, titanium, or titanium nitride. In such an alternative embodiment, n-type metal layer 215, which serves as the workfunction metal, may be between about 50 and about 1,000 Angstroms thick.

In embodiments in which trench 213 includes both a workfunction metal and a trench fill metal, the resulting metal NMOS gate electrode may be considered to comprise the combination of both the workfunction metal and the trench fill metal. If a trench fill metal is deposited on a workfunction metal, the trench fill metal may cover the entire device when deposited, forming a structure like the FIG. 2K structure. That trench fill metal must then be polished back so that it fills only the trench, generating a structure like the FIG. 2L structure.

In the illustrated embodiment, after forming n-type metal layer 215 within trench 213, patterned layer 206a is removed to generate trench 250 that is positioned between sidewall spacers 210, 211. In one embodiment involving a polysilicon layer 206, layer 206a is exposed to a solution that comprises between about 20 and about 30 percent TMAH by volume in deionized water for a sufficient time at a sufficient temperature (e.g., between about 60° C. and about 90° C.), while applying sonic energy, to remove all of layer 206a without removing significant portions of n-type metal layer 215, the layer 206b or if present the etch stop layer 10. Then the exposed portions of the sidewall spacers 210 and 211 may be removed by a selective etch to produce the FIG. 2M structure. The etch stop layer 10 may also be removed if present.

Thereafter, the layer 206b may be removed by selectively etching. Second dummy dielectric layer 207 may be removed and replaced with gate dielectric layer 260, using process steps like those identified above. Gate dielectric layer 260 may comprise a high-k gate dielectric layer. Optionally, as mentioned above, a capping layer (which may be oxidized after it is deposited) may be formed on gate dielectric layer 260 prior to filling trench 250 with a p-type metal.

Figure 2O:
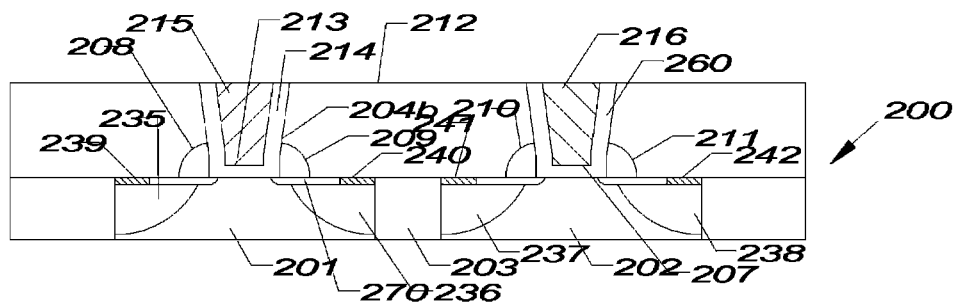

In this embodiment, however, after replacing layer 207 with layer 260, p-type metal layer 216 is formed directly on layer 260 to fill trench 250 and to generate the FIG. 2O structure. P-type metal layer 216 may comprise any p-type conductive material from which a metal PMOS gate electrode may be derived.

Materials that may be used to form p-type metal layer 216 include: ruthenium, palladium, platinum, cobalt, nickel, and conductive metal oxides, e.g., ruthenium oxide. P-type metal layer 216 may be formed on gate dielectric layer 260 using well known PVD or CVD processes, e.g., conventional sputter or atomic layer CVD processes. As shown in FIG. 2O, p-type metal layer 216 is removed except where it fills trench 250. Layer 216 may be removed from other portions of the device via a wet or dry etch process, or an appropriate CMP operation, with dielectric 212 serving as an etch or polish stop. P-type metal layer 216 may serve as a metal PMOS gate electrode with a workfunction that is between about 5.0 eV and about 5.4 eV, and that is between about 100 Angstroms and about 2,000 Angstroms thick, for example, between about 500 Angstroms and about 1,600 Angstroms thick.

Although FIG. 2O represents structures in which p-type metal layer 216 fills all of trench 250, in alternative embodiments, p-type metal layer 216 may fill only part of trench 250. As with the metal NMOS gate electrode, the remainder of the trench may be filled with a material that may be easily polished, e.g., tungsten, aluminum, titanium, or titanium nitride. In such an alternative embodiment, p-type metal layer 216, which serves as the workfunction metal, may be between about 50 and about 1,000 Angstroms thick. Like the metal NMOS gate electrode, in embodiments in which trench 250 includes a workfunction metal and a trench fill metal, the resulting metal PMOS gate electrode may be considered to comprise the combination of both the workfunction metal and the trench fill metal.

Although a few examples of materials that may be used to form layers 204, 206, dummy dielectric layers 205, 207 and metal layers 215 and 216 are described here, those layers may be made from many other materials, as will be apparent to those skilled in the art. Although this embodiment illustrates forming a metal NMOS gate electrode prior to forming a metal PMOS gate electrode, alternative embodiments may form a metal PMOS gate electrode prior to forming a metal NMOS gate electrode.

After removing metal layer 216, except where it fills trench 250, a capping dielectric layer (not shown) may be deposited onto dielectric layer 212, metal NMOS gate electrode 215, and metal PMOS gate electrode 216, using any conventional deposition process. Process steps for completing the device that follow the deposition of such a capping dielectric layer, e.g., forming the device's contacts, metal interconnect, and passivation layer, are well known to those skilled in the art and will not be described here.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming an upper and lower stacked layers and said layers abutting against and surrounded by sidewall spacers;
    selectively removing only a portion of each of said spacers around said stacked layers;
    covering said stacked layers with material and planarizing said material;
    etching said upper layer and stopping the etch on said lower layer;
    removing the lower layer to form a trench; and
    forming a replacement metal gate in said trench.

2. The method of claim 1, wherein forming said upper and lower stacked layers comprises forming a multi-layer stack of different materials.

3. The method of claim 1, further comprising forming an etch stop layer separating said upper and lower stacked layers.

4. The method of claim 1, further comprising removing and replacing a dielectric layer from a bottom of said trench.

5. The method of claim 1, wherein forming a replacement metal gate in said trench comprises depositing a first metal to only partly fill said trench and filling said trench with a second metal.

* * * * *